United States Patent [19]
Chambers

[11] Patent Number: 4,864,405
[45] Date of Patent: Sep. 5, 1989

[54] CRT VIDEO DISPLAY DEVICE WITH AUTOMATICALLY ADJUSTABLE SCANNING AMPLITUDE

[75] Inventor: John P. Chambers, Tadworth, England

[73] Assignee: British Broadcasting Corporation, London, England

[21] Appl. No.: 9,663

[22] Filed: Feb. 2, 1987

[30] Foreign Application Priority Data

Feb. 4, 1986 [GB] United Kingdom ............... 8602644

[51] Int. Cl.⁴ ..................... H04N 7/08; H04N 7/12
[52] U.S. Cl. ............................... 358/180; 358/146; 358/230
[58] Field of Search ............... 358/160, 166, 174, 180, 358/230, 242, 146, 142, 140

[56] References Cited

U.S. PATENT DOCUMENTS

| | | | |
|---|---|---|---|
| 4,394,690 | 7/1983 | Kobayashi | 358/146 |
| 4,556,906 | 12/1985 | Dischert | 358/180 |
| 4,567,508 | 1/1986 | Hulyer | 358/140 |
| 4,651,208 | 3/1987 | Rhodes | 358/22 |
| 4,713,685 | 12/1987 | Nishimura | 358/140 |

FOREIGN PATENT DOCUMENTS

| | | |
|---|---|---|
| 2481554 | 10/1981 | France . |
| 76984 | 4/1987 | Japan . |
| 1285554 | 5/1977 | United Kingdom . |
| 2179828A | 4/1981 | United Kingdom . |
| 2073536 | 10/1981 | United Kingdom . |
| 2126450 | 3/1984 | United Kingdom . |

OTHER PUBLICATIONS

Tutorial: The Shape of Screens to Come, by Richard A. Strain, SMPTE Journal, Jul., 1988, pp. 560-567.
Colour Television Channel Type 2001, Instruction Manual, vol. 2, EMI, Electronics, Ltd., Stages, Middlesex, England, Apr., 1968.
Master Control Colour Monitors, A-B Versions, Type CTVM 3/37-3/5 1, Instruction Manual, 2 circuit Designs, "Horizontal Oscillator" and Vertical Deflection, Barco Video Systems, (Undated but published in Jun., 1982).
Handbook, Medford DU5 Series, Colour Monitor, Issue 5, May, 1984.
Rank Cintel Mk IIIC Telecine, Drawing excerpt from vol. 2, Part 1, Servicing Information, (1 Circuit Diagram entitled "Tube Control System", (undated, but published in 1981).
Handbook, Medford DU6 Series, PAL Colour Monitor, Mar., 1986.
Designs Department Handbook No. 7.336 (86), BBC Design Department, Engineering Division, Sheets 4, 5, 20, 25, 26, 29, 40, 41, (undated, but published on Jun. 25, 1986).

Primary Examiner—Tommy P. Chin
Attorney, Agent, or Firm—Robert F. O'Connell

[57] ABSTRACT

A cathode ray tube video display device is adapted to display wide aspect ratio signals by reducing the vertical scanning amplitude of the scanning raster. The scan is collapsed in the vertical direction without reducing the number of lines used to display the active picture, leaving unscanned bands at the top and bottom of the display. The device can change between a normal raster scanning mode and such a collapsed wide screen mode automatically in response to an indicator in the received video signal.

10 Claims, 2 Drawing Sheets

CRT VIDEO DISPLAY DEVICE WITH AUTOMATICALLY ADJUSTABLE SCANNING AMPLITUDE

BACKGROUND OF THE INVENTION

This invention relates to cathode ray tube (CRT) video display devices such as for use in broadcast television receivers.

Various proposals exist for the transmission, reception and display of signals representative of pictures with higher aspect ratios (the ratio of width to height) than the conventional 4:3. For example, the MAC family of systems (multiplexed analogue components) includes provision for transmitting signals with aspect ratios of e.g. 5.3:3 or 16:9 by compressing the horizontal luminance and chrominance information by more than the 3:2 and 3:1 compressions, respectively, normally applied. Such altered compression ratios would be signalled to the receivers by inclusion of a special 'flag' in the signal broadcast by the transmitter. Suitably-equipped receivers with a 4:3 aspect-ratio display could then display the centre part of the picture, with marginal information at the sides of the picture being lost. This is illustrated in FIG. 3 of the drawings, where 'lost' information is indicated by shaded areas.

It has also been proposed to transmit in the signal a code indicating the region of the picture where the main action is at any instant. This allows such a receiver to follow the action in a programme, or pan, and select any particular 4:3 picture from the wider-screen picture to fill the display, under the control of the code entered by the broadcaster. This is illustrated in FIG. 4, showing an instant when the lost information is all at one side of the picture.

Another, but generally less acceptable, possibility is to fill the 4:3 display with the entire wide-screen picture, resulting in an anamorphic distortion to the picture geometry, as shown in FIG. 5.

SUMMARY OF THE INVENTION

The present invention is defined in the appended claims to which reference should now be made.

An alternative method of displaying wider aspect ratio pictures on a conventional aspect ratio display is now proposed. In this method the signal fills the entire screen width, but the vertical scanning amplitude of the CRT display device is reduced by the factor necessary to preserve picture geometry. Thus the CRT scanning circuits are adapted to be capable of operation in an alternative mode wherein the scanning amplitude is less than necessary to produce a full vertical scan.

The change of vertical scan amplitude can preferably be under the automatic control of the transmitted signals. Thus a special code is included in the transmission indicating that the wider aspect ratio is in use.

BRIEF DESCRIPTION OF THE DRAWINGS

The invention will now be described in more detail by way of example with reference to the drawings, in which.

DETAILED DESCRIPTION OF THE PREFERRED EMBODIMENT

Figure 1:
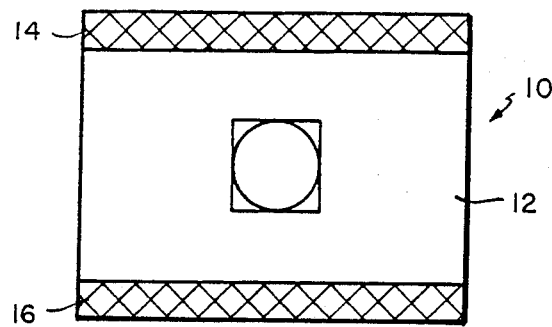
FIG. 1 illustrates a displayed picture on a CRT in accordance with this invention.
Figures 3, 4:
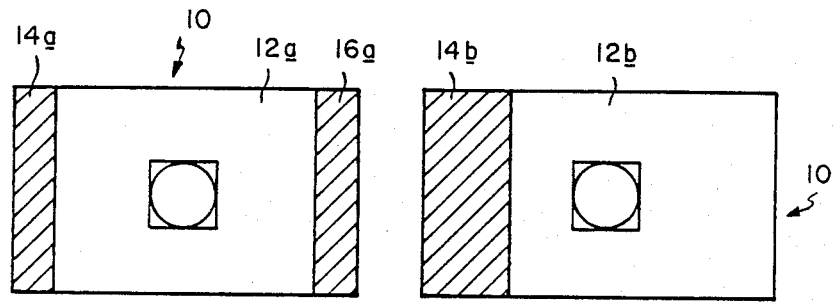
FIGS. 3, 4 and 5 (referred to above) are illustrations similar to FIG. 1 for known display techniques.
Figure 5:
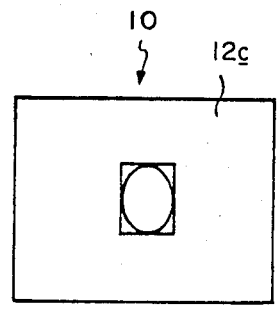

FIG. 1 illustrates a display 10 in accordance with this invention in which the vertical scanning amplitude of the CRT is reduced by a factor necessary to preserve picture geometry. Thus, if a signal at a conventional line standard of 525 or 625 lines per picture were being displayed, all the active lines are produced in a broad central band 12 on the face of the display tube. The top and bottom areas 14, 16 of the screen, shown cross-hatched in FIG. 1, are completely blank. The CRT scanning spot does not even reach these areas.

In other words the scan is collapsed in the vertical direction without the number of lines used to display the active picture being reduced.

This contrasts with known systems for displaying wide aspect ratio pictures in which the 525 or 625 lines cover the full height of the screen but only a proportion of these lines are used to carry picture information. In the present case 525 or 625 line definition is still preserved and the need to use interpolative techniques avoided.

The method is also applicable to so-called high definition television (HDTV) systems where a higher member of lines are used to form each picture.

The reduction in the vertical scanning amplitude is proportional to the ratio of the aspect ratios involved. Thus in the example of a 5.3:3 aspect ratio signal being transmitted and received by a 4:3 display, the vertical scanning amplitude needs to be reduced to 4/5.3 or about 75% of its full value.

Figure 2:
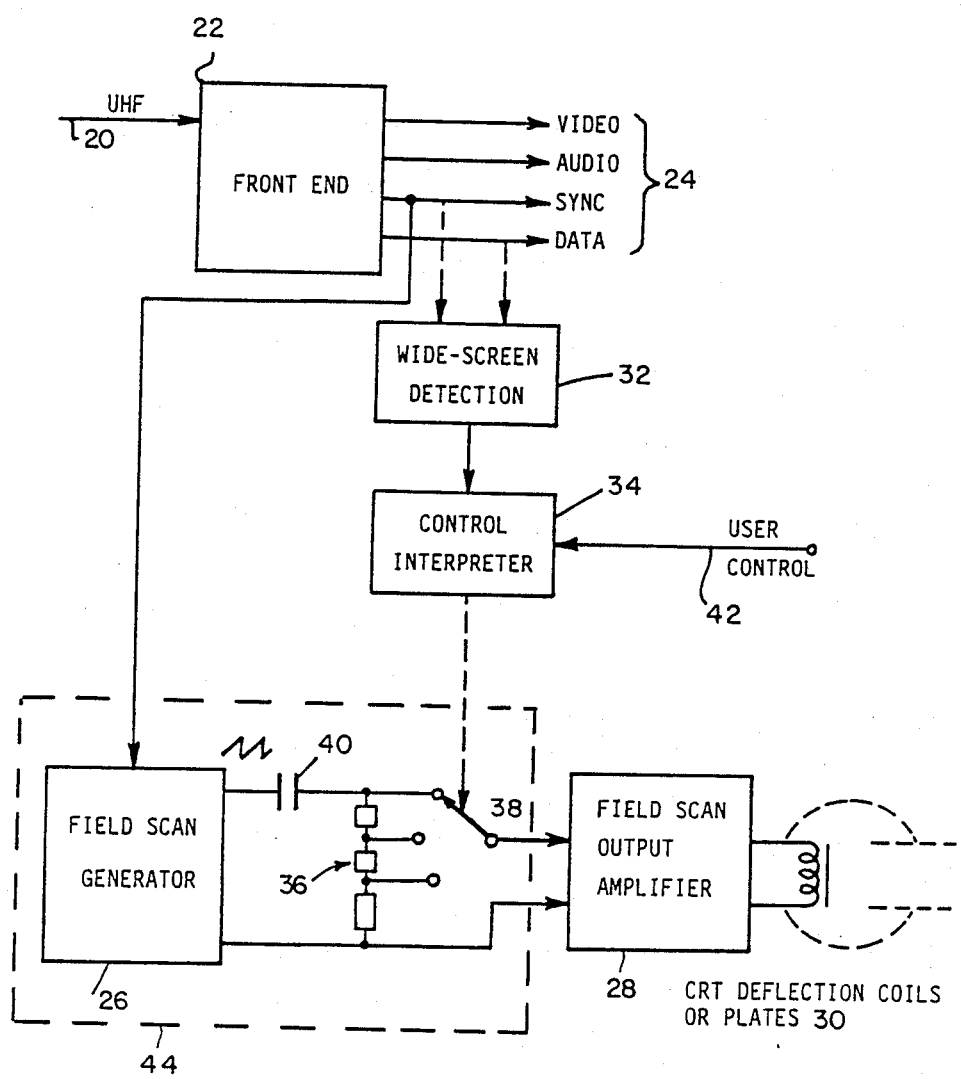
FIG. 2 is a block circuit diagram of the pertinent parts of a television receiver embodying the invention.

FIG. 2 is a block circuit diagram of the part of a broadcast television receiver modified in accordance with this invention. The rest of the receiver can be entirely conventional and is not therefore described in detail. The receiver 20 shown in FIG. 2 has a UHF input from an aerial which is applied to conventional "front-end" circuitry 22 comprising R.F. and I.F. circuits, sound and sync. separators, etc. The circuitry 22 provides video, audio, synchronisation and possibly data outputs 24. The sync. output is applied to a scanning means 44 which includes a field scan generator 26 to synchronise the field scan, which is coupled through a field scan output amplifier 28 to CRT deflection coils or plates 30. As thus far described the circuitry is essentially conventional.

The video signal may be analogue (e.g. PAL, NTSC or MAC) or digital. The audio signal may also be analogue or digital. In a receiver designed to accept wide-screen television there will be information within the signal to identify the signal as being distinct from a conventional signal corresponding to a display with a 4:3 aspect ratio. This information may be transmitted in the synchronising signal or in a separate data component signal.

In accordance with this invention, the receiver includes a wide-screen detection circuit 32 connected to the data and/or sync. outputs of "front-end" circuitry 22 to detect the presence of a wide screen signal. This information is interpreted in a control unit 34 which controls a two or more way selector switch 38 connected to various taps on a resistive voltage divider 36 of scanning means 44. The voltage divider is connected across the output of field scan generator 26 through a capacitor 40 which provides a.c. coupling so that the reduced signal is still centred about substantially the same point, rather than being offset towards the top or bottom of the screen.

Control unit 34 may simply always collapse the field scan so that a wide screen signal is displayed in full. However, intermediate stages are possible where some of the picture width is lost at the sides of the picture, and the scanned picture height is not so severely reduced. These intermediate stages may be selected by a user control 42. The user control can also, exceptionally, select a state in which there is no reduction in the vertical scan. If the picture geometry is to be preserved in these cases, i.e. circles are to remain circular, a corresponding horizontal expansion of the signal is required. In the MAC system this is possible by altering the decoder clock rate. The unit 34 can also possibly take account of transmitted information indicative of the preferred viewing area, namely that part of the whole transmitted picture which contains the centre of the action.

I claim:

1. A video display device for displaying pictures with a raster of a fixed number of horizontally-scanned lines comprising:
    input means for receiving a video signal including an indicator related to the aspect ratio of said received video signal;
    a cathode ray tube for displaying pictures represented by said received video signal;
    scanning means for the cathode ray tube for scanning with a defined vertical scanning amplitude, the scanning means including switching means to switch the scanning means between a first mode of operation in which the defined vertical scanning amplitude of the scanning means covers a full vertical scan of the cathode ray tube, and a second mode of operation in which the defined vertical scanning amplitude of the scanning means covers a reduced vertical scan of the cathode ray tube; and
    control means coupled to the scanning means and responsive to said indicator in said received video signal to automatically switch the scanning means between said first and second modes of operation.

2. A video display device according to claim 1, including:
    a.c. coupling means connected to the scanning means to a.c. couple the defined vertical scanning amplitude and thereby vertically center a displayed picture about a point having a substantially identical horizontal position in said first and second modes of operation.

3. A video display device according to claim 1, in which said indicator is included in a video synchronizing signal.

4. A video display device according to claim 1, in which said indicator is a separate data component signal.

5. A video display device according to claim 1, further including:
    user control means coupled to said control means to provide additional control signals for the scanning means to additionally alter the defined vertical scanning amplitude of the scanning means.

6. A video display device according to claim 5, in which a horizontal expansion or compression of a displayed picture is generated corresponding to any said additional alteration of the defined vertical scanning amplitude.

7. A method of displaying on a cathode ray tube video display device pictures with a raster of a fixed number of horizontally-scanned lines, comprising the steps of:
    receiving a video signal representing an image having a defined aspect ratio and including an indicator related to said defined aspect ratio of said received video signal;
    automatically switching between at least a first and a second mode of operation in accordance with the received indicator, said modes of operation having different defined vertical scanning amplitudes; and
    displaying the received video signal with a selected defined vertical scanning amplitude on the cathode ray tube.

8. A method according to claim 7, including the step of:
    a.c. coupling the vertical scanning amplitude of a scanning means to vertically center a displayed picture about a substantially identical horizontal position in the said first and second modes of operation.

9. A method according to claim 7, including the step of detecting a user control signal to additionally alter the selected defined vertical scanning amplitude.

10. A method of producing a raster display on a cathode ray tube video display device having raster scanning circuits, said method including the steps of
    operating said scanning circuits to provide automatically a horizontal scanning amplitude which produces a full horizontal scan;
    operating said scanning circuits to provide a vertical scanning amplitude which produces less than a full vertical scan in response to an indicator signal included in a received video signal; and
    displaying pictures represented by said received video signal on the cathode ray tube.

* * * * *